(12) United States Patent
Wirz et al.

(10) Patent No.: US 10,825,761 B2
(45) Date of Patent: Nov. 3, 2020

(54) ELECTRONIC DEVICES HAVING TAPERED EDGE WALLS

(71) Applicant: Micron Technology, Inc., Boise, ID (US)

(72) Inventors: Brandon P. Wirz, Boise, ID (US); Jack E. Murray, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/200,843

(22) Filed: Nov. 27, 2018

(65) Prior Publication Data

US 2019/0109080 A1     Apr. 11, 2019

Related U.S. Application Data

(62) Division of application No. 15/730,272, filed on Oct. 11, 2017, now Pat. No. 10,276,479.

(51) Int. Cl.
*H01L 23/48*     (2006.01)
*H01L 23/498*    (2006.01)
(Continued)

(52) U.S. Cl.
CPC .... *H01L 23/49811* (2013.01); *H01L 21/4825* (2013.01); *H01L 21/7688* (2013.01); *H01L 21/76879* (2013.01); *H01L 24/11* (2013.01); *H01L 24/13* (2013.01); *H01L 2224/0401* (2013.01); *H01L 2224/05567* (2013.01); *H01L 2224/10126* (2013.01); *H01L 2224/1148* (2013.01); *H01L 2224/131* (2013.01); *H01L 2224/133* (2013.01); *H01L 2224/13022* (2013.01); *H01L 2224/1329* (2013.01);
(Continued)

(58) Field of Classification Search
CPC ......... H01L 23/49811; H01L 21/76879; H01L 21/7688; H01L 21/4825; H01L 2225/06513
See application file for complete search history.

(56) References Cited

U.S. PATENT DOCUMENTS 6,146,510 A     11/2000 Leader et al.
6,791,164 B2    9/2004  Farnworth
(Continued)

OTHER PUBLICATIONS

Brok et al., Inkjet-Based Additive Manuracturing Addresses Challenges in Semiconductor Packaging, Chip Scale Review, ChipScaleReview.com, (Mar.-Apr. 2017), 3 pages.

*Primary Examiner* — Robert G Bachner
(74) *Attorney, Agent, or Firm* — TraskBritt (57) ABSTRACT

An electronic device includes a substrate, a structure over the substrate having an edge wall defining at least a portion of an opening exposing a surface of the substrate, and a dielectric material adjacent and in contact with the edge wall and an adjacent portion of the surface of the substrate. The dielectric material has a profile tapering downward from adjacent the edge wall toward the substrate. Other electronic devices include a substrate and a solder mask over the substrate. The solder mask defines an opening therethrough. A supplemental mask is within the opening of the solder mask, and has a sidewall that slopes away from the solder mask. A conductive structure is adjacent and in contact with at least one of the solder mask or the supplemental mask.

20 Claims, 5 Drawing Sheets

(51) Int. Cl.
*H01L 21/48* (2006.01)
*H01L 21/768* (2006.01)
*H01L 23/00* (2006.01)

(52) U.S. Cl.
CPC ........... *H01L 2224/13082* (2013.01); *H01L 2224/13144* (2013.01); *H01L 2224/13147* (2013.01); *H01L 2225/06513* (2013.01); *H01L 2924/14* (2013.01); *H01L 2924/1431* (2013.01); *H01L 2924/1434* (2013.01); *H01L 2924/35121* (2013.01)

(56) References Cited

U.S. PATENT DOCUMENTS

| | | |
|---|---|---|
| 6,800,946 B2 | 10/2004 | Chason et al. |
| 6,833,627 B2 | 12/2004 | Farnworth |
| 6,893,904 B2 | 5/2005 | Akram |
| 7,331,106 B2 | 2/2008 | Workman et al. |
| 8,823,168 B2 | 9/2014 | Wachtler |
| 2003/0092220 A1* | 5/2003 | Akram .................. H01L 21/56 438/110 |
| 2006/0159838 A1* | 7/2006 | Kowalski .............. B82Y 30/00 427/58 |
| 2008/0036086 A1 | 2/2008 | Ishio |
| 2010/0139963 A1* | 6/2010 | Ishido .................. H05K 1/111 174/260 |

\* cited by examiner

ELECTRONIC DEVICES HAVING TAPERED EDGE WALLS

CROSS-REFERENCE TO RELATED APPLICATION

This application is a divisional of U.S. patent application Ser. No. 15/730,272, filed Oct. 11, 2017, now U.S. Pat. No. 10,276,479, issued Apr. 30, 2019, the disclosure of which is hereby incorporated herein in its entirety by this reference.

TECHNICAL FIELD

The present disclosure, in various embodiments, relates generally to methods of processing semiconductor devices and related structures. More particularly, the present disclosure relates to method of altering topographies of materials employed in semiconductor device fabrication.

BACKGROUND

Large-scale production of particular types of semiconductor devices poses problems peculiar to the type of die, electronic circuits, external connectors, and packaging. For example, so-called "flip-chip" dice comprise electronic devices formed on a semiconductor substrate whose integrated circuitry terminates in an array of conductive sites on a die's active surface, which conductive sites are typically referred to as "bond pads." External conductive structures exemplified by solder "bumps" or "balls" are attached to the bond pads. In use, the flip-chip die is inverted, positioned atop a substrate with contact pads matching the locations of the conductive structures of the die, and the conductive structures bonded to the contact pads of the substrate. Chip scale, flip-chip configured packages are also typically disposed face down over a higher-level substrate with which the chip scale packages are to be connected.

In order to fabricate flip-chip dice in large quantities, several semiconductor dice are simultaneously fabricated on a wafer. The wafer is then scribed or sawn into individual dice, and finishing operations including packaging are conducted on the singulated dice.

It is typically desirable to apply a supportive or protective dielectric material, such as a solder mask, on at least the active surfaces of semiconductor devices or substrates, such as organic packaging substrates, flip-chip type dice, and chip-scale packages, that will be connected to another semiconductor device or to higher-level packaging. Polymers, glass, and other electrically nonconductive materials may be applied to one or both major surfaces of such semiconductor devices. Conventionally, such dielectric materials are applied to a surface of a semiconductor device prior to forming or attaching conductive structures to bond pads or conductive traces exposed through openings in the material. Openings are formed, for example, by etching, in the material to accommodate the subsequent formation or attachment of conductive structures in the openings.

When conventional techniques are employed to form such a protective dielectric material on a surface of a semiconductor device, it is difficult to form openings in the protective dielectric material and form or attach conductive structures, such as solder bumps or balls, in contact with one another within the openings. Thus, during a TCB (thermocompression bonding) process, voids may occur in the NCF (nonconductive film, which may also be referred to herein and in the art as a wafer level underfill (WLUF)) between an edge of the protective dielectric material defining at least part of an opening and a surface of a conductive structure therein.

The problem arises due to the abrupt edge of openings resulting from conventional techniques used to form openings in solder masks, which result in abrupt, vertical edge walls of the openings, or even a slight undercut of the edge walls. As a result, a void trapping air between a solder bump and the edge wall of the associated opening may be formed. Voids may occur in various locations, such as along an edge of a solder mask, in between interconnects, or between an interconnect and the side of the solder mask.

Such voids may present reliability issues, particularly when a flowable NCF is employed between stacked semiconductor devices, and specifically shorting between adjacent conductive structures. Typically, NCF is laminated onto the wafer prior to dicing the wafer. Therefore the NCF is on the die already during the stacking process. The voids may compromise the ability of the NCF to provide dielectric isolation between laterally adjacent conductive structures. The NCF keeps solder from moving across multiple interconnects. If a void bridges multiple interconnects, solder can fill the void and cause a short. Also, if there is a void next to an interconnect, the solder can move into the void and cause an open interconnect. Thus, underfill layers with air pockets or voids may not completely support or protect the die or the conductive structures secured to the bond pads thereof. The increased use of NCF materials does not cure the voiding problem. Voids may cause shorting between adjacent traces, semiconductor device delamination from the substrate, and solder flowing into the voids, starving solder joint locations of sufficient solder to effect a robust interconnection.

Figure 13:
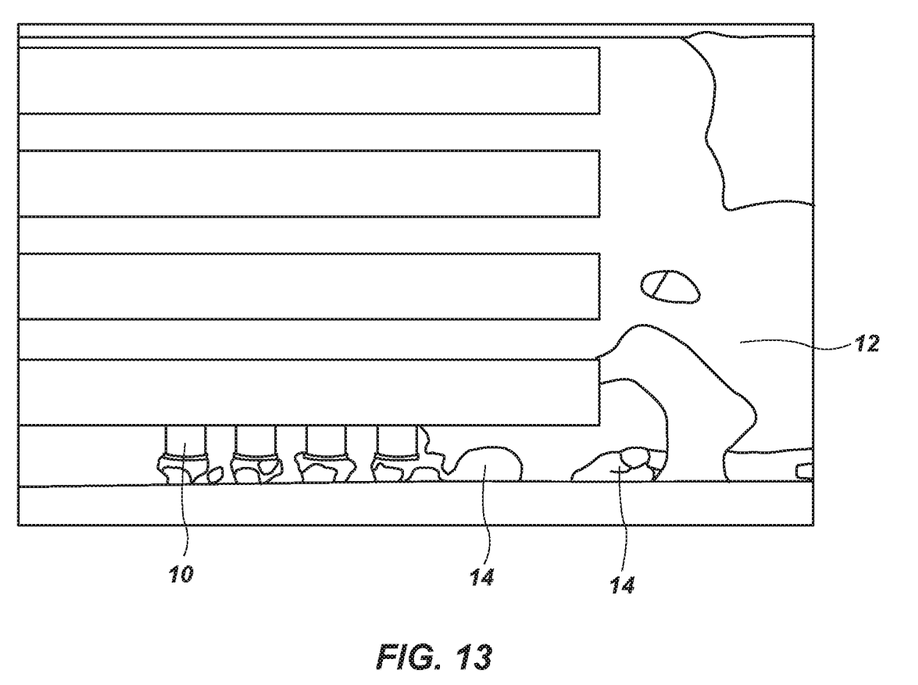
FIG. 13 is a line drawing illustrating a y-axis cross-section of interconnects formed by conventional processes.

FIG. 13 is a line-drawings illustrating a y-axis cross-section of interconnects 10 and NCF material 12. The interconnects (which may be, for example, Cu, Ni, Sn, or Ag) are electroplated to a semiconductor substrate prior to laminating the NCF material 12 onto the wafer. The structure is then subjected to TCB, at which point the voids 14, appearing in the lower right corner of FIG. 13, are formed.

Attempts have been made to eliminate such voids through the use of multiple overlapping solder masks, each mask having a slightly larger opening than the mask below, resulting in a stair-step edge wall around each opening. Such attempts are not entirely successful, and add time, cost, and complexity to the fabrication process.

DETAILED DESCRIPTION

In some embodiments disclosed herein, methods of processing a semiconductor device are described, as are semiconductor structures. Some methods include providing a material, for example a solder mask, over a major surface of a substrate, depositing particles of another material by direct material deposition adjacent and in contact with an edge wall of the solder mask to form a supplemental mask over the major surface of the substrate. Optionally, a metal material may be deposited over the major surface of the substrate adjacent and in contact with the supplemental mask.

As used herein, the term "semiconductor substrate" means and includes a base material or construction upon which components, such as those of memory cells and peripheral circuitry, as well as logic, may be formed. Semiconductor substrates may include a semiconductor package substrate, a ceramic package substrate, an organic package substrate, or other package substrate. The semiconductor substrate may be a substrate wholly of a semiconductor material, a base semiconductor material on a supporting structure, or a semiconductor substrate having one or more materials, structures, or regions formed thereon. The semiconductor substrate may be a conventional silicon substrate or other bulk substrate including a semiconductor material. As used herein, the term "bulk substrate" means and includes not only silicon wafers, but also silicon-on-insulator ("SOP") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, wherein x is, for example, a mole fraction between 0.2 and 0.8), germanium (Ge), gallium arsenide (GaAs), gallium nitride (GaN), or indium phosphide (InP), among others. Furthermore, when reference is made to a "semiconductor substrate" in the following description, previous process stages may have been utilized to form materials, regions, or junctions, as well as connective elements such as lines, plugs, and contacts, in the base semiconductor structure or foundation, such components comprising, in combination, integrated circuitry. Semiconductor substrates may also be, for example, a carrier wafer that does not have components formed therein.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90°, inverted, flipped, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

Embodiments are described herein with reference to the illustrations. The illustrations presented herein are not meant to be actual views of any particular material, component, structure, device, or system, but are merely idealized representations that are employed to describe embodiments of the present disclosure. Variations from the shapes of the illustrations as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims.

The following description provides specific details, such as material types and processing conditions, in order to provide a thorough description of embodiments of the disclosed compositions and methods. However, a person of ordinary skill in the art will understand that the embodiments of the present disclosure may be practiced without employing all these specific details.

Any fabrication processes described herein do not form a complete process flow for processing semiconductor devices. Preceding, intermediary, and final process stages are known to those of ordinary skill in the art. Accordingly, only the methods and semiconductor structures necessary to understand embodiments of the present devices and methods are described herein.

Reference will be made to the drawings, where like numerals refer to like components throughout. The drawings are not necessarily to scale.

Disclosed are methods of processing semiconductor devices. Some methods include providing a patterned mask over a major surface of a substrate, the mask defining at least one opening therein, and depositing particles of material by direct material deposition adjacent and in contact with the mask to form a supplemental mask over the major surface of the substrate.

In some embodiments, methods include forming a dielectric material over and in contact with a surface of a substrate adjacent and in contact with a side wall of a structure on the substrate by direct material deposition. The dielectric material may have a surface profile tapered downwardly from the side wall toward the substrate.

Figure 1:
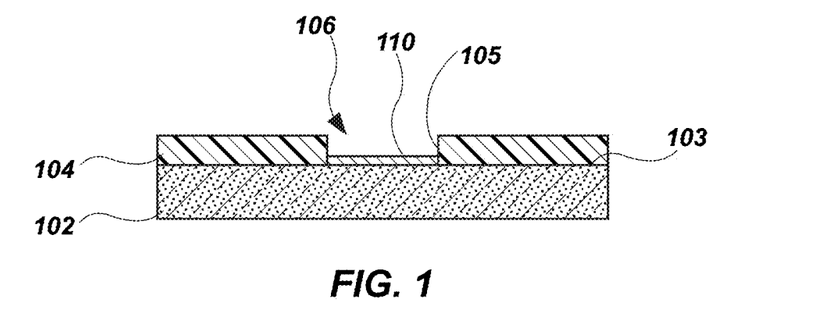
FIG. 1 is a simplified cross-section of a substrate over which a conductive structure and a solder mask are secured.

FIG. 1 illustrates a simplified cross-section of a substrate 102 bearing a conductive structure 110, for example a bond pad or a conductive trace, and over which a solder mask 104 is located. The substrate 102 may be any semiconductor substrate, such as an SOI substrate, an SOS substrate, an SOG substrate, etc., having integrated circuitry thereon. The substrate 102 may be a printed circuit board or a component thereof. The solder mask 104 may be a dielectric material configured to inhibit solder material from flowing away from the conductive structure 110 on the substrate 102. The solder mask 104 may comprise a polymer, such as an epoxy. The solder mask 104 may be provided over a major surface 103 of the substrate 102 by techniques known in the art, and may, for example, be patterned after application thereof by photolithography.

Figure 2:
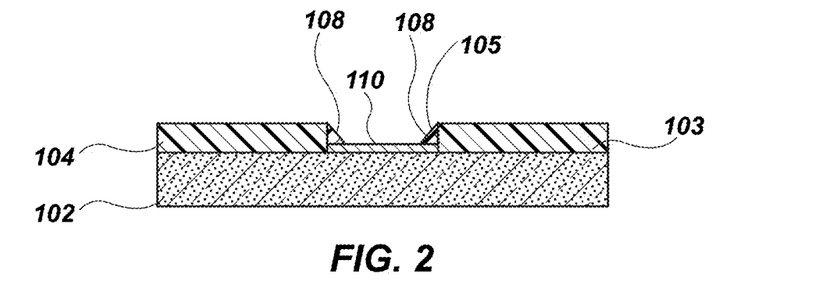
FIG. 2 is a simplified cross-section of the substrate shown in FIG. 1 after a supplemental mask has been applied.

The solder mask 104 may define an opening 106 therein, through which the major surface 103 and/or the conductive structure 110 or a portion thereof is exposed. As shown in FIG. 2, a supplemental mask 108 may be formed over the major surface 103 of the substrate 102 and adjacent and in contact with an edge wall 105 of the solder mask 104, which defines at least a portion of a boundary of opening 106. The supplemental mask 108 may be applied by depositing droplets or other particles of material in an additive manufacturing process, which may also be characterized as a direct material deposition process. Such processes include, without limitation, material jetting (i.e., ink-jet printing, such as is employed in 3-D printing) and aerosol jet printing, also known as Maskless Mesoscale Materials Deposition (M3D). The supplemental mask 108 may be formed to cover an interface between the edge wall 105 of the solder mask 104 and the major surface 103 of the substrate 102. The supplemental mask 108 may include, for example, a polyimide, a polyimide-like material, an epoxy, an epoxy-acrylate, a wax-based material, etc. The supplemental mask 108 may comprise the same material as the solder mask 104 or a different material than the solder mask 104. The material of the supplemental mask 108 may be formulated, for example, to cure under application of ultraviolet (UV) radiation, or to heat-cure, or both.

Figure 3:
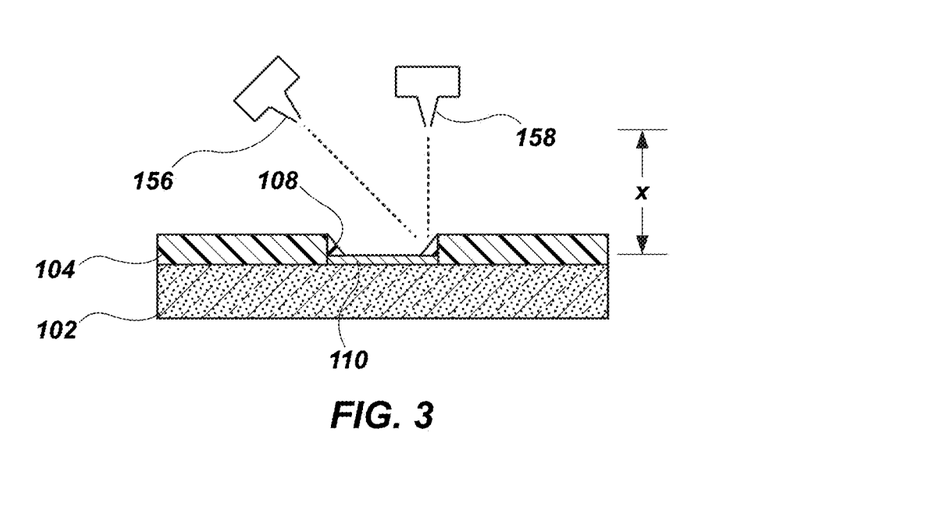
FIG. 3 is a simplified cross-section illustrating how the supplemental mask shown in FIG. 2 may be applied.

FIG. 3 illustrates how the supplemental mask 108 may be formed. In a direct material deposition process, small droplets of a liquid material may be expelled from one or more nozzles 156, 158 (which may comprise hundreds or even thousands of nozzles) over the substrate 102.

At the time of the deposition of the particles to form the supplemental mask 108, a distance x between the nozzles 156, 158 and the major surface 103 of the substrate 102 or the surface of the conductive structure 110 may be from about 0.05 mm to about 5 mm, such as from about 0.1 mm to about 2 mm, or even from about 0.5 mm to about 1 mm. Thus, the deposition of the supplemental mask 108 may be performed with the nozzles 156, 158 contacting neither the substrate 102, nor the conductive structure 110, nor the solder mask 104.

The droplets of the liquid material may have volumes in a range from, for example, about 0.5 picoliter to about 1 nanoliter. For example, in some embodiments, the droplets may have a volume of about 30 picoliter. In some embodiments, the droplets may have mean diameters in a range from, for example, about 100 nm to 50 μm, such as from about 500 nm to about 20 μm, or from about 700 nm to about 5 μm. The mean diameter of the droplets may be approximately equal to the diameter of the nozzle 156, 158 from which the droplets exit. Thus, the nozzles 156, 158 may also have diameters in a range from, for example, about 100 nm to 50 μm, such as from about 500 nm to about 20 μm, or from about 700 nm to about 5 μm.

The liquid material may have a viscosity in a range from, for example, about 0.1 centiPoise (cP) to about 1000 cP, such as from about 1 cP to about 100 cP, or from about 2 cP to about 20 cP. Suitable materials are offered, for example, by Dow Chemical Company, of Midland, Mich.; E.I. du Pont de Nemours and Company, of Wilmington, Del.; Taiyo America, Inc., of Carson City, Nev.; and JNC Corporation, of Tokyo, Japan. A suitable inkjet printer for implementation of embodiments of the disclosure is offered commercially by Meyer Burger (Netherlands) B.V.

The supplemental mask 108 may be formed to have a maximum thickness, as measured from the major surface 103 of the substrate 102 or from an exposed surface of the conductive structure 110 to an upper extent of the supplemental mask 108, in a range from about 1 μm to about 1000 μm, such as from about 5 μm to about 500 μm, or from about 10 μm to about 100 μm. The maximum thickness of the supplemental mask 108 may be selected to be approximately the same as the thickness of the solder mask 104, or approximately the same as the difference in thickness between the solder mask 104 and the conductive structure 110.

The nozzles 156, 158 may be arranged to have any selected orientation with respect to the substrate 102. For example, the nozzle 156 is shown as expelling particles at an oblique angle to the major surface 103 of the substrate 102. The nozzle 158 is shown as expelling particles normal (i.e., perpendicular) to the major surface 103 of the substrate 102. The orientation and placement of the nozzles 156, 158 may be used to influence the shape of the supplemental mask 108 formed on the substrate 102 and to ensure that the material of supplemental mask 108 adheres to the edge wall 105 of the solder mask 104, to the substrate 102, or conductive structure 110. Furthermore, though only two nozzles 156, 158 are shown in FIG. 3 for simplicity of illustration, any suitable number of nozzles may be used to deposit the particles that form the supplemental mask 108. The nozzles 156, 158 (including any other nozzles not shown in FIG. 3) may be used to simultaneously expel particles onto the substrate 102. In some embodiments, some of the nozzles 156, 158 may expel particles onto the substrate 102 at the same time that other nozzles 156, 158 are inactive. The nozzles 156, 158 to be used at any given time may be selected based on the cross-sectional shape (e.g., profile) of the supplemental mask 108 to be formed. That is, particles may be selectively expelled from a subset of the nozzles 156, 158 at one time, and from a different subset of the nozzles 156, 158 at a different time. The nozzles 156, 158 may be configured to deliver particles within about + or −10 μm, within about + or −5 μm, or even within about + or −1 μm of a selected location. That is, the nozzles 156, 158 may have a precision within about 10 μm, within about 5 μm, or even within about 1 μm. The nozzles 156, 158 may deliver particles over the same portion of the substrate 102 in a single pass or in multiple passes to produce the supplemental mask 108 having a selected cross-sectional shape. For example, the nozzles 156, 158 may be used to "build up" the supplemental mask 108 by applying particles over the same position on the substrate 102 multiple times.

Figure 4:
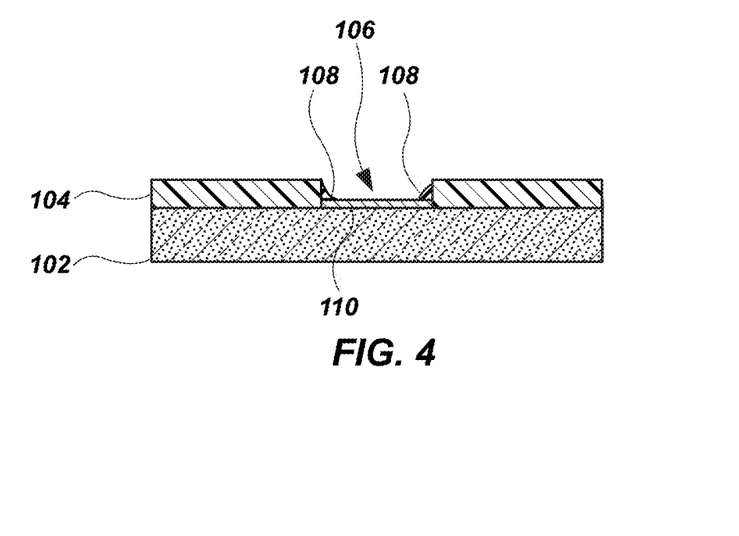
FIG. 4 is a simplified cross-section illustrating different shapes of the supplemental mask.

FIG. 4 illustrates some different cross-sectional shapes in which the supplemental mask 108 may be formed, which may be arcuate. For example, the portion of the supplemental mask 108 on the left of the opening 106 has a surface curved inward (i.e., concave) toward the interface between the solder mask 104 and the substrate 102. The portion of the supplemental mask 108 on the right of opening 106 has a surface curved outward (i.e., convex) away from the interface between the solder mask 104 and the substrate 102. Furthermore, and as shown in FIG. 2, the surface of the supplemental mask 108 may have a linear profile in the plane of view shown in FIG. 2.

The supplemental mask 108 may be formed such that the surface of the supplemental mask 108 intersects the major surface 103 of the substrate 102 at an angle between about 10° and about 80°, such as between about 30° and about 60°, or even about 45°. In other words, the supplemental mask 108 may form a solder mask opening having an inwardly tapered side wall (i.e., sloping away from the solder mask 104).

Figure 5:
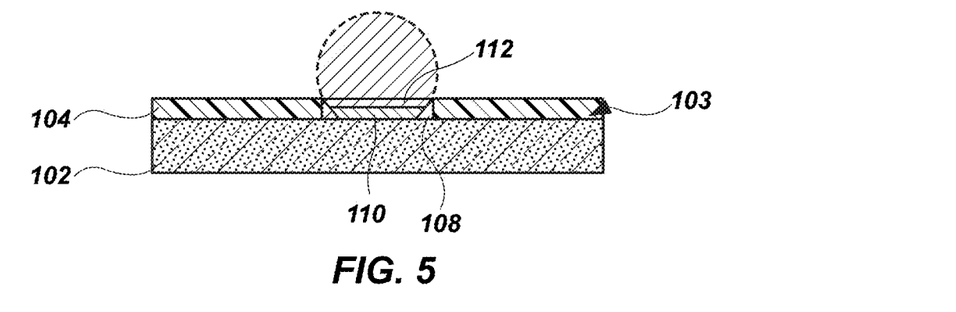
FIG. 5 is a simplified cross-section illustrating another conductive material formed adjacent the supplemental mask.

As shown in FIG. 5, another conductive material 112 may optionally be deposited over the conductive structure 110 adjacent the supplemental mask 108. For example, a solder bump may be deposited or formed within the opening 106 defined by the supplemental mask 108 and the conductive structure 110. In some embodiments, the conductive material 112 may be or may connect to a pillar or other structure. The conductive material 112 may include, for example, solder, gold, copper, a conductive resin, or a conductor-filled resin.

Figure 6:
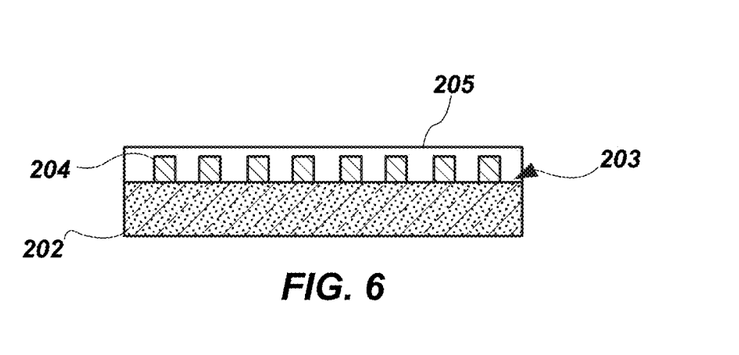
FIG. 6 is a simplified cross-section illustrating another substrate having a conductive material thereon.

FIG. 6 illustrates a simplified cross-section of a substrate 202. One or more conductive structures 204, for example conductive traces, may be formed over a major surface 203 of the substrate 202 within an opening in a mask 205. The conductive structures 204 may be formed by any method known in the art, such as screen printing, blanket metal film application, electrolytic deposition and photolithographic patterning, patterning a seed material and electroless deposition, laser resist ablation and etching of an underlying metal material, etc.

Figure 7:
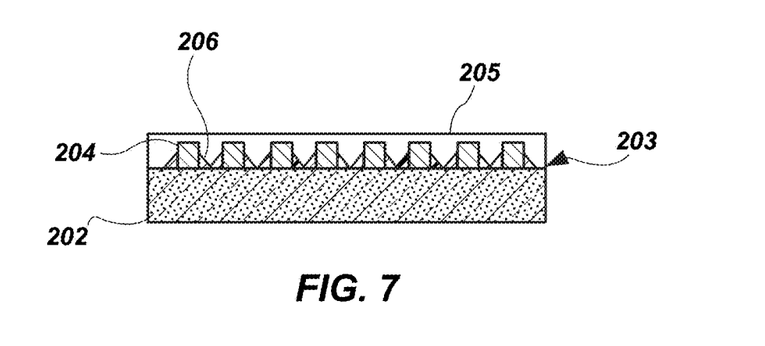
FIG. 7 is a simplified cross-section of the substrate shown in FIG. 6 after a mask has been applied.

As shown in FIG. 7, mask elements 206 may be applied over the major surface 203 of the substrate 202 adjacent the conductive structures 204 and the mask 205. The mask elements 206 may be applied by direct material deposition or additive manufacturing as described above, and all the material properties, conditions, and permutations discussed above may be used to form the mask elements 206. The mask elements 206 may entirely surround the interface between the mask elements 206 and the substrate 202 within the opening in the mask 205.

Figure 8:
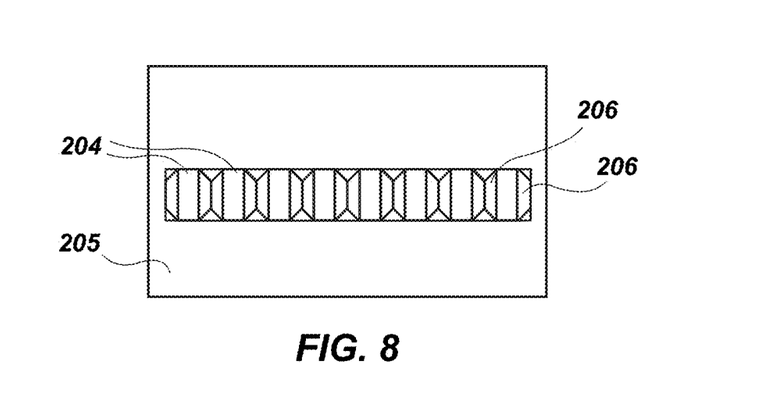
FIG. 8 is a plan view showing the structure of FIG. 7.

FIG. 8 is a plan view showing the mask 205, conductive structures 204, and mask elements 206 depicted in FIG. 7. As shown in FIG. 8, the mask elements 206 may be sloped to surround edges of the conductive structures 204, and may overlap one another. The structure substrate 202, conductive structures 204, and mask elements 206 shown in FIGS. 7 and 8 may form an electronic device. The conductive structures 204 may have an edge wall defining at least a portion of an opening exposing a surface of the substrate 202. The mask elements 206 may be a dielectric material adjacent and in contact with the edge wall and an adjacent portion of the surface of the substrate 202. The mask elements 206 may have a profile tapering downward from adjacent the edge wall toward the substrate 202 (FIG. 7) below the mask 205.

Figure 9:
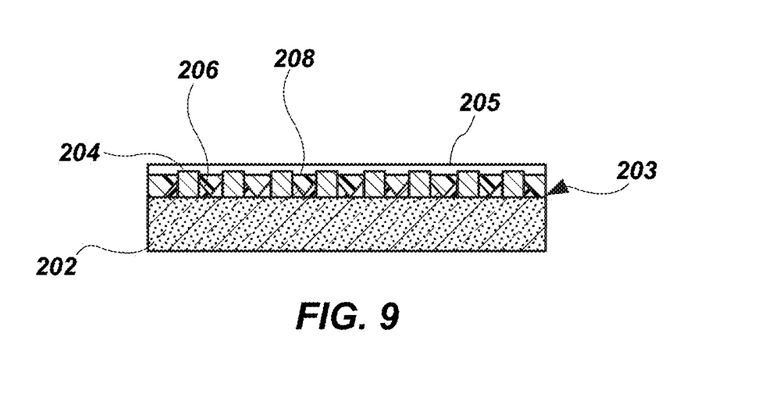
FIG. 9 is a simplified cross-section of the substrate shown in FIG. 7 after an underfill material has been applied.

The mask elements 206 may limit or prevent separation of the conductive structures 204 from the substrate 202 at the bondline during subsequent processing. In some embodiments, and as shown in FIG. 9, the substrate 202 may be subjected to a WLUF process, yet mask elements 206 may prevent void formation adjacent areas of contact between the conductive structures 204 and the substrate 202. An underfill material 208 may be applied over the mask elements 206. The underfill material 208 may be a nonconductive epoxy-based material, and may be applied at a thickness from about 10 μm to about 50 μm.

The supplemental mask 108 (FIGS. 2-5) and the mask elements 206 (FIGS. 7-9) disclosed herein may have various other benefits. For example, masks as described may provide lateral support for other features on a semiconductor substrate, such that the semiconductor structure is more mechanically robust.

As another example, masks may be formed to have a shape that alters a path through which another material may flow, such that areas of potential voids are eliminated and air is pushed out of areas between the mask and another material flowing over the mask. This benefit may limit the occurrence of problems common in conventional methods, such as the creation of a conductive path between adjacent solder bumps or traces, semiconductor device delamination from a substrate, voids which undesirably fill with solder, starving an interconnect so that solder flows out and creates an open, and problems with device reliability. Such benefits may be particularly valuable in helping to eliminate voids from forming at an interface between a die and a substrate. Other benefits may include, for example, formation of ball grid array (BGA) packaging, in which solder balls are arranged in a compact grid on a substrate.

Masks and methods of forming masks as disclosed herein may be beneficial for filling any open area on a semiconductor or other substrate. For example, direct material deposition or additive manufacturing may be used to fill in an opening over a conductive plug formed in a semiconductor structure, or may be used to form a tapered structure or other topography.

Figure 10:
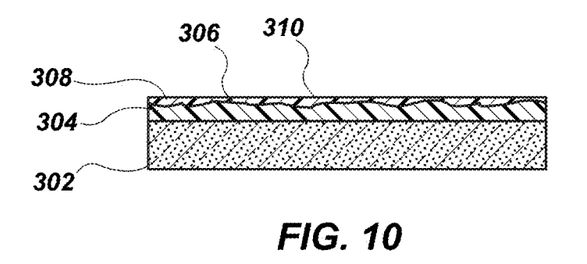
FIG. 10 is a simplified cross-section illustrating a substrate having a material thereon, and upon which another material is added by direct material deposition to change a topography of the surface.

In some embodiments, a method comprises applying a material to an exposed surface to alter the topography thereof. For example, FIG. 10 illustrates a simplified cross-section of a substrate 302 having a material 304 thereon. As shown, a surface 306 of the material 304 may be rough or irregular. Using direct material deposition, another material 308 may applied over the material 304. The resulting surface 310 of the material 308 may have a lower roughness or irregularity than the surface 306 of the material 304. In some embodiments, the material 308 may be deposited directly on the substrate 302. In certain embodiments, the surface 310 may have a higher roughness or irregularity in topography than the surface 306.

Figure 11:
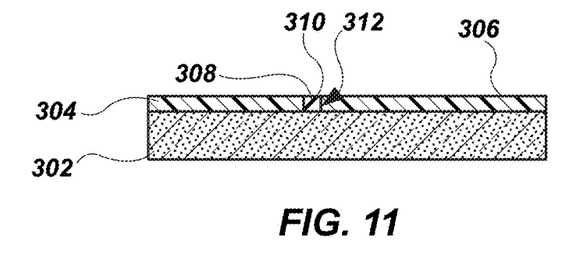
FIG. 11 is a simplified cross-section illustrating a substrate having a material thereon, and upon which another material is added by direct material deposition to fill a void.

In certain embodiments, and as shown in FIG. 11, the material 304 may define an opening 312 therein, and the material 308 may be applied to substantially fill the opening 312. The surface 310 of the material 308 may be coplanar with the surface 306. In other embodiments, additional material 308 may be added to cover the surface 306 of the material 304.

Figure 12:
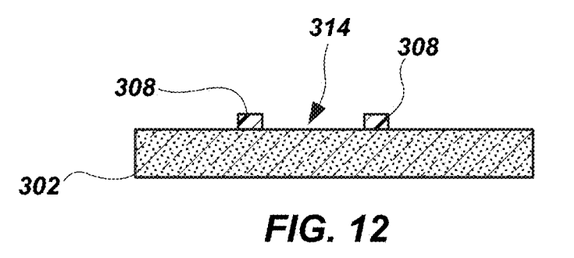
FIG. 12 is a simplified cross-section illustrating a substrate having a material added by direct material deposition to form or alter a flow path.

In some embodiments, and as shown in FIG. 12, the material 308 may be used to form or alter a flow path 314 through which a flowable material, for example an encapsulant material, may be directed across the substrate 302.

Another advantage of processes as disclosed is that supplier specifications may be relaxed as compared to conventional processes. That is, direct material deposition or additive manufacturing may be used to form masks that can cover imperfections in substrate surfaces and bondlines that would cause failure in conventional processes. If the supplier specifications are more relaxed, the cost of parts (e.g., substrates, with or without conductive materials thereon) may be lower, and it may be easier to manage the supply chain (e.g., because defects or deviations in workpieces are less likely to cause a stoppage in manufacturing, because multiple suppliers may be able to meet specifications, etc.).

Direct material deposition or additive manufacturing may also be used to smooth out abrupt topography changes on substrates, which abrupt topography changes can cause voids and other imperfections. This may be particularly valuable in the formation of DRAM (dynamic random-access memory), 3DI (three-dimensional integration) packages, which have higher bandwidth and operate at higher speeds than memory meeting earlier standards.

While the disclosed device structures and methods are susceptible to various modifications and alternative forms in implementation thereof, specific embodiments have been shown by way of example in the drawings and have been described in detail herein. However, it should be understood that the present disclosure is not intended to be limited to the particular forms disclosed. Rather, the present invention encompasses all modifications, combinations, equivalents, variations, and alternatives falling within the scope of the appended claims and their legal equivalents.

What is claimed is:

1. An electronic device, comprising:
    a substrate;
    a structure over the substrate, the structure having an edge wall defining at least a portion of an opening exposing a surface of the substrate; and
    a dielectric material laterally adjacent and in contact with the edge wall of the structure, the dielectric material also in contact with an adjacent portion of the surface of the substrate, the dielectric material having a profile tapering downward from adjacent the edge wall toward the substrate,
    the structure comprising a different material than the dielectric material.

2. The electronic device of claim 1, wherein the profile comprises a profile selected from the group consisting of a linear profile, a concave profile, and a convex profile.

3. The electronic device of claim 1, wherein the structure comprises a mask structure.

4. The electronic device of claim 1, wherein the structure comprises a conductive structure.

5. The electronic device of claim 4, wherein the conductive structure comprises a trace or a bond pad.

6. The electronic device of claim 1, wherein the dielectric material entirely surrounds an interface between the structure and the substrate.

7. The electronic device of claim 1, further comprising an underfill material over the dielectric material.

8. The electronic device of claim 7, wherein the underfill material comprises a nonconductive epoxy-based material.

9. The electronic device of claim 7, wherein the underfill material has a thickness from about 10 µm to about 50 µm.

10. The electronic device of claim 1, wherein the profile of the dielectric material exhibits a convex profile curving outward away from an interface between the structure and the substrate.

11. An electronic device, comprising:
    a substrate;
    a solder mask over the substrate, the solder mask defining an opening therethrough;
    a supplemental mask within the opening of the solder mask, the supplemental mask having a sidewall that slopes away from the solder mask and exhibits a convex surface curving outward away from an interface between the solder mask and the substrate; and
    a conductive structure adjacent and in contact with at least one of the solder mask or the supplemental mask.

12. The electronic device of claim 11, further comprising another conductive material over and in contact with the conductive structure.

13. The electronic device of claim 12, wherein the another conductive material comprises a pillar.

14. The electronic device of claim 12, wherein the another conductive material comprises a material selected from the group consisting of solder, gold, copper, a conductive resin, and a conductor-filled resin.

15. The electronic device of claim 11, wherein the supplemental mask intersects a major surface of the substrate at an angle between about 10° and about 80°.

16. The electronic device of claim 11, wherein the supplemental mask has another sidewall that exhibits a concave surface curving inward toward the interface between the solder mask and the substrate.

17. The electronic device of claim 11, wherein the supplemental mask has a maximum thickness in a direction normal to a major surface of the substrate, in a range from about 1 µm to about 1000 µm.

18. The electronic device of claim 11, wherein the solder mask comprises a polymer.

19. The electronic device of claim 18, wherein the solder mask comprises an epoxy.

20. The electronic device of claim 11, wherein the substrate comprises a printed circuit board.

* * * * *

UNITED STATES PATENT AND TRADEMARK OFFICE
CERTIFICATE OF CORRECTION

PATENT NO. : 10,825,761 B2
APPLICATION NO. : 16/200843
DATED : November 3, 2020
INVENTOR(S) : Brandon P. Wirz and Jack E. Murray Page 1 of 1

It is certified that error appears in the above-identified patent and that said Letters Patent is hereby corrected as shown below:

In the Specification
Column 3, Line 42, change "("SOP") substrates," to --("SOI") substrates,--

Signed and Sealed this
Twenty-second Day of December, 2020

Andrei Iancu
*Director of the United States Patent and Trademark Office*